United States Patent [19]

Misono

[11] Patent Number: 4,719,365
[45] Date of Patent: Jan. 12, 1988

[54] CLOCKED LOGIC DELAY DEVICE WHICH CORRECTS FOR THE PHASE DIFFERENCE BETWEEN A CLOCK SIGNAL AND AN INPUT BINARY SIGNAL

[75] Inventor: Toshiaki Misono, Gyoda, Japan

[73] Assignee: Takeda Riken Kogyo Kabushikikaisha, Tokyo, Japan

[21] Appl. No.: 685,542

[22] Filed: Dec. 24, 1984

[30] Foreign Application Priority Data

Dec. 29, 1983 [JP] Japan ............................ 58-251522

[51] Int. Cl.⁴ .................... H03K 1/17; H03K 17/00
[52] U.S. Cl. ............................ 307/269; 307/480; 307/262; 328/63; 328/72; 328/133; 328/155
[58] Field of Search ............. 307/269, 262, 480, 593, 307/597, 606, 608; 328/55, 58, 63, 72, 155, 133

[56] References Cited

U.S. PATENT DOCUMENTS 4,386,323  5/1983  Jansen .................................. 328/63

Primary Examiner—Stanley D. Miller
Assistant Examiner—Timothy P. Callahan
Attorney, Agent, or Firm—Staas & Halsey

[57] ABSTRACT

A clocked logic circuit operates in synchronism with a clock and is supplied with an input binary signal asynchronously with the clock for issuing an output binary signal. A phase detector circuit produces a phase difference signal indicating into which of k divided phase regions of one period of the clock falls, the phase difference between the input binary signal and the clock. The phase difference signal is delayed by a matching delay means for a delay approximately equal to a delay of the clocked logic circuit. An output binary signal from the clocked logic circuit is given a delay corresponding to one of the k phase regions designated by the delayed phase difference signal, and the delayed output binary signal is issued to an output terminal.

15 Claims, 24 Drawing Figures

|  | OUTPUT OF PHASE DET 25 | | | OUTPUT OF LATCH 27 | | OUTPUT OF DECODER 40 | | | | CORRECTIVE DELAY |
|---|---|---|---|---|---|---|---|---|---|---|
|  | 21 | 22 | 23 | 29 | 28 | 45 | 44 | 43 | 42 |  |
| 0ns < $\phi$ ≤ 1ns | 0 | 0 | 0 | 0 | 0 | 1 | 0 | 0 | 0 | 3ns |
| 1ns < $\phi$ ≤ 2ns | 1 | 0 | 0 | 1 | 0 | 0 | 1 | 0 | 0 | 2ns |
| 2ns < $\phi$ ≤ 3ns | 1 | 1 | 0 | 0 | 1 | 0 | 0 | 1 | 0 | 1ns |
| 3ns < $\phi$ ≤ 4ns | 1 | 1 | 1 | 1 | 1 | 0 | 0 | 0 | 1 | 0ns |

FIG. 14
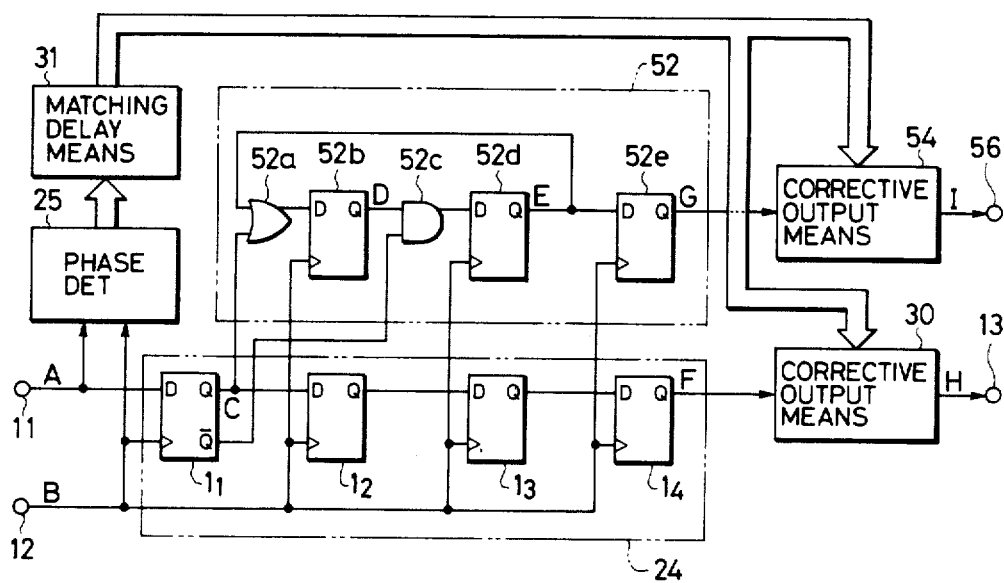
FIG. 15A
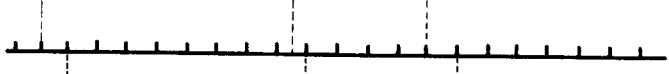
FIG. 15B
FIG. 15C
FIG. 15D
FIG. 15E
FIG. 15F
FIG. 15G
FIG. 15H
FIG. 15I

CLOCKED LOGIC DELAY DEVICE WHICH CORRECTS FOR THE PHASE DIFFERENCE BETWEEN A CLOCK SIGNAL AND AN INPUT BINARY SIGNAL

BACKGROUND OF THE INVENTION

The present invention relates to a clocked logic device supplied with a binary signal for issuing the binary signal in synchronism with a clock signal (hereinafter referred to as a "clock") which is in asynchronism with the supplied binary signal.

Where a binary signal is delayed by an analog delay line, for example, the delay is influenced to a greater extent by a change in ambient temperature or the like as the delay time increases. To avoid this drawback, it has been the practice to employ a clocked logic device for delaying a binary signal. The logic circuit has a delay circuit composed for example of n D-type flip-flops (n is an integer of 2 or more) connected in cascade. The first D-type flip-flops is supplied with the binary signal which is successively transferred through the D-type flip-flops by a clock which is in asynchronism with the binary signal, and the final D-type flip-flops issues the binary signal which has been delayed by about $(n-1)T_o$ ($T_o$ is the period of the clock). The binary signal delayed by the delay circuit of the logic circuit is less affected by changes in ambient temperature since the signal is delayed by the stable clock.

Since however the input binary signal and the clock are asynchronous with each other in the delay circuit of the logic circuit, the delay of the output binary signal is subjected to an error dependent on the phase difference between the input binary signal and the clock. The error approximates the clock period $T_o$ at maximum. To reduce this error, the rate of the clock might be increased, but flip-flops operable at a high speed would be expensive and there would be a limitation on increasing the operating speed of the flip-flops. It has therefore been difficult to obtain a delay of high accuracy by using a logic circuit as the delay circuit.

In the case where it is desired to shift the synchronization phase of an output binary signal from a logic oscillation circuit oscillating in synchronism with a clock so that the phase of the oscillation output may coincide with, for example, the rise of an input binary signal which is in asynchronism with the clock, the phase shift can be achieved with high accuracy through the use of the clock of a higher frequency. However, as mentioned previously, such a logic circuit operable at high frequency is expensive.

SUMMARY OF THE INVENTION

It is an object of the present invention to provide a clocked logic device which reduces a maximum error to an extent smaller than a clock period and which can be constructed relatively inexpensively.

According to the present invention, the phase difference between an input binary signal and a clock is detected by a phase detector circuit which produces a phase difference signal indicative of which of k (k is an integer of 2 or greater) divided regions of one clock period $T_o$ the detected phase difference falls in. The input binary signal is applied to a clocked logic circuit operating in synchronism with the clock and producing an output binary signal which is delayed from the input binary signal. A delay substantially equal to the delay which the output binary signal has with respect to the input binary signal is given by a matching delay means to the phase difference signal from the phase detector circuit. The delayed phase difference signal and the output binary signal from the clocked logic circuit are supplied to a corrective output means. The corrective output means comprises a corrective delay means and a selection means. The corrective delay means can delay the output binary signal by the respective k delays $j \cdot T_o/k$ ($j=0, 1, 2, \ldots k-1$) corresponding to the k phase regions. The selection means is responsive to the phase difference signal for delivering out the output binary signal which has been delayed for one of the k delays by the corrective delay means. The sum of the delay selected by the selection means and the time corresponding to the detected phase difference is rendered constant. The corrective delay means and the selection means may be arranged one in front of the other, or may be combined together. With the above arrangement, the delay (phase) error of the output binary signal with respect to the input binary signal may have a maximum value which is $1/k$ of the clock period $T_o$.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 14 is a logic diagram of a clocked logic device incorporated in a circuit arrangement including a logic oscillator circuit controlled by an input binary signal; and FIGS. 15A through 15I are timing charts showing the logic states of various components of the clocked logic device of FIG. 14 during operation thereof.

DESCRIPTION OF THE PREFERRED EMBODIMENTS

Figure 1:
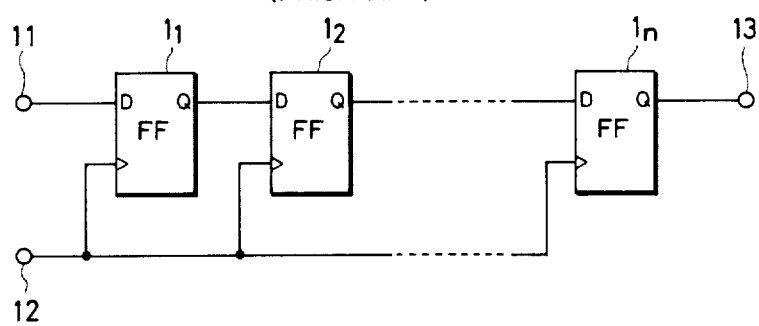
FIG. 1 is a logic diagram of a delay circuit of a conventional logic circuit.

Prior to describing embodiments of the present invention, a conventional clocked logic circuit employed as a delay circuit will be described with reference to FIG. 1. In FIG. 1, a pulse signal (input binary signal) applied from an input terminal 11 is supplied to a data terminal D of a first stage $1_1$ of a plurality of cascaded D-type flip-flops $1_1$ through $1_n$ which have clock terminals supplied with a clock from a clock terminal 12. Each time a clock pulse is applied, the input pulse signal is shifted successively through the flip-flops $1_1, 1_2, \ldots 1_n$. Therefore, the final flip-flop $1_n$ supplies an output terminal 13 with an output pulse which has been delayed by about $(n-1)$ times the clock period To. The delay circuit of this logic circuit has a maximum delay error which remains constant regardless of whether the delay is long or short. More specifically, where the phase difference between the input pulse applied to the input terminal 11 and the clock applied to the clock terminal 12 is small for immediate delivery of the input pulse, the delay error is small. Where the clock is delayed from the input pulse for substantially one period of the clock, the delay error is maximized and approximately equal to the period To of the clock.

Figure 2:
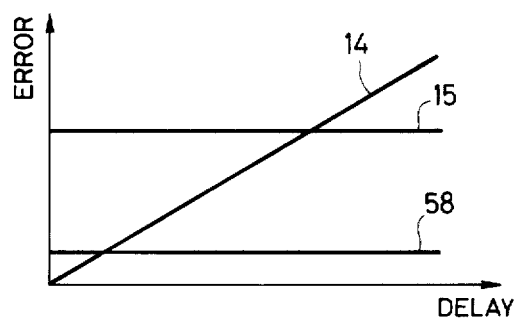
FIG. 2 is a graph showing the relationship between a delay time and a delay error in various delay circuits.

In an analog circuit, the error becomes greater in proportion to the delay time as indicated by the line 14 in FIG. 2. However, the delay circuit of the clocked logic circuit of FIG. 1 has a constant delay error even if the delay time is long as indicated by the line 15. To reduce the delay error in the delay circuit of FIG. 1, the period of the clock applied to the input terminal 12 should be shortened. However, to meet such a requirement, it is necessary to use flip-flops $1_1$ through $1_n$ which operate at a high speed and are expensive. Moreover, the approach of increasing the operating speed of the flip-flops suffers a limitation, and hence it has been difficult to produce a delayed output having high accuracy.

Figure 4A:
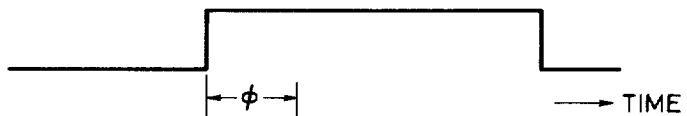
FIGS. 4A and 4B are illustrative of a phase relationship between an input binary signal and a clock.
Figure 4B:
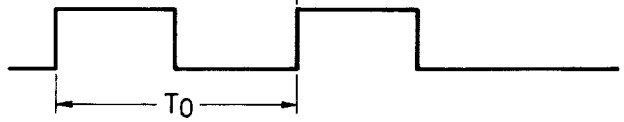
Figure 3:
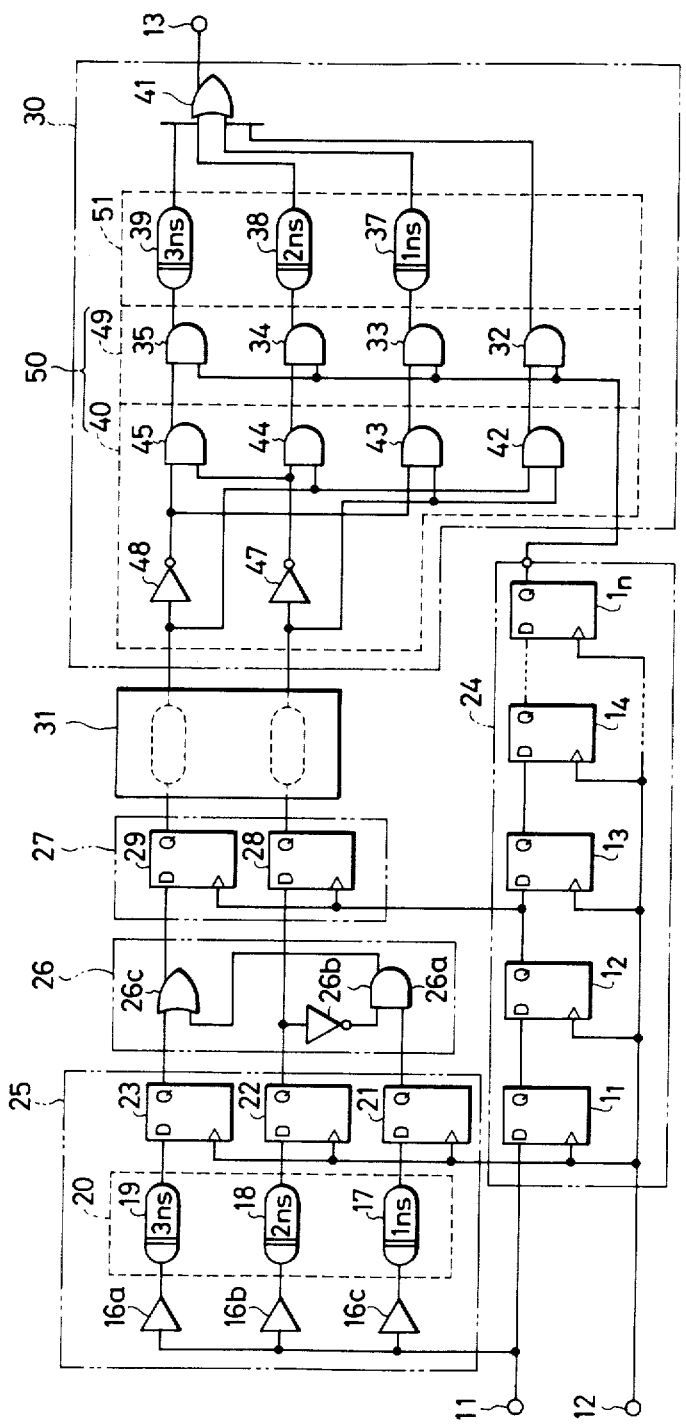
FIG. 3 is a logic diagram of a delay circuit in which a clocked logic device of the present invention is incorporated.

FIG. 3 is illustrative of a clocked logic device of the present invention as it is incorporated in the delay circuit shown in FIG. 1. A clock applied to a clock terminal 12 has a frequency of 250 MHz, for example, and hence a period of 4 nsec. A signal input terminal 11 is supplied with an input binary signal as shown in FIG. 4A, which is supplied to a first stage of the clocked logic circuit 24, or the delay circuit, which is composed of a plurality of D-type flip-flops $1_1$ through $1_n$ connected in cascade. The input binary signal is applied successively to the flip-flops $1_1$ through $1_n$ by the clock applied to the clock terminal 12. The clock applied to the clock terminal 12 is not in synchronism with the input binary signal applied to the terminal 11. For example, the clock as shown in FIG. 4B is not in synchronism with the variation in logic state of the input binary signal shown in FIG. 4A. As described above, the period To of the clock is 4 nsec, and the pulse duration or width of the input binary signal is longer than the clock period To. The input binary signal has a front edge (i.e. a rise) which is not generally aligned with the front edge of the clock in timing.

According to the present invention, the phase difference between the input binary signal applied to the terminal 11 and the clock applied to the terminal 12 is detected with higher accuracy than the clock period To. In the illustrated embodiment, a phase detector circuit 25 detects a phase difference signal indicative of a phase difference $\phi$ between the input binary signal and the clock, belonging to any one of four divided phase regions of the clock period To (k=4). More specifically, since the clock period is 4 nsec, the phase difference detector circuit 25 detects which one of the phase regions 0-1, 1-2, 2-3 and 3-4 nsec the phase difference belongs to. In the phase detector circuit 25, the input binary signal is fed through buffers $16a$, $16b$, $16c$ to delay lines 17, 18, 19 having respective delay times 1 nsec, 2 nsec, 3 nsec, from which outputs are supplied to data terminals D of D-type flip-flops 21, 22, 23 having trigger terminals supplied with the clock from the terminal 12.

Therefore, when the clock is applied immediately after the input binary signal supplied to the first flip-flop $1_1$ of the clocked logic circuit 24 has been changed from a logic 0 to a logic 1 and before the lapse of 1 nsec therefrom, the flip-flops 21, 22, 23 take therein a logic 0. When the clock from the terminal 12 goes high immediately after the input binary signal applied to the flip-flop 21 has been changed from a logic 0 to a logic 1 and before the lapse of 1 nsec therefrom, the flip-flops $1_1$, 21 are of a logic 1 and the flip-flops 22, 23 are of a logic 0. When the clock goes high immediately after the input binary signal applied to the flip-flop 22 has been changed from a logic 0 to a logic 1 and before the lapse of 1 nsec therefrom, that is, in the event the input binary signal at the terminal 11 is ahead by slightly greater than 2 nsec from the clock phase, the flip-flops $1_1$, 21, 22 are of a logic 1, and the flip-flop 23 is of a logic 0. When the clock is applied immediately after the input binary signal applied to the flip-flop 23 has been changed to a logic 1 and before the lapse of 1 nsec therefrom, that is, in case the input binary signal to the terminal 11 is ahead by slightly greater than 3 nsec from the clock phase, the flip-flops $1_1$, 21 through 23 are of a logic 1.

Figures 5, 6:
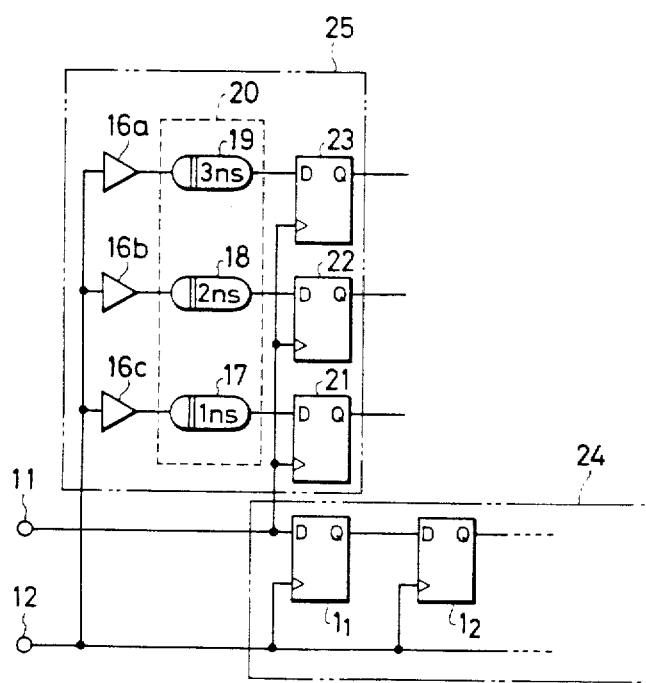
FIG. 5 is a table showing the logic states of various components in the delay circuit of FIG. 3 dependent on the phase difference between the input binary signal and the clock.
FIG. 6 is a logic diagram of a phase detector circuit in which a clock is delayed.

With the phase difference between the input binary signal and the clock being divided into the four regions, the states of the outputs of the flip-flops 21 through 23 vary in those four regions as shown in FIG. 5. The phase detector circuit 25 is composed of the delay circuits 17 through 19 and the flip-flops 21 through 23 for detecting the phase difference between the input binary signal and the clock. The delay circuits 17 through 19 constitute a phase detecting delay means 20.

The phase difference signal indicative of the phase difference between the input binary signal and the clock is latched by a latch means 27 during a period longer than the pulse width of the input binary signal, and the output of the latch means 27 is then delayed by a matching delay means 31 having substantially the same delay as that of the clocked logic circuit 24. Although the phase difference signal from the phase detector circuit 25 may be directly supplied to the latch means 27, the phase difference signal is coded by an encoder 26 in the illustrated embodiment and then the coded signal is applied to the latch means 27. This arrangement is effective in reducing the number of transmission lines in the delay means 31. For example, the encoder 26 is constructed such that the output from the flip-flop 21 is supplied to an AND circuit $26a$, and the output from the flip-flop 22 is delivered as it is and also supplied to the AND circuit $26a$ via an inverter $26b$. An output from the AND circuit $26a$ and an output from the flip-flop 23 are applied to an OR circuit $26c$. Two outputs from the encoder 26, that is, the output from the flip-flop 22 and the output from the OR circuit $26c$, are latched by D-type flip-flops 28, 29 of the latch means 27 in response to the delayed input binary signal from the output of the flip-flop $1_2$ until the next output is obtained from the flip-flop $1_2$. Outputs from the flip-flops 28, 29 are supplied respectively to the delay means 31. The outputs from the flip-flops 28, 29 are 00, 01, 10, or 11 dependent on which of the four phase regions the detected phase difference falls in as shown in FIG. 5. The matching delay means 31 has a delay slightly shorter than the delay time $(n-2)To$ effected by the flip-flops $1_3$ through $1_n$ in the clocked logic circuit 24. Where the variation period of the input binary signal applied to the terminal 11 is longer than the delay time of the clocked logic circuit 24, the matching delay means 31 may be omitted.

An output binary signal from the clocked logic circuit 24, that is, an output from the flip-flop $1_n$, is delayed and issued by a corrective output means 30 dependent on the previously detected phase difference between the input binary signal and the clock. The corrective output means 30 can selectively give delays corresponding respectively to the four phase regions in the phase detector circuit 25 to the output binary signal. The corrective output means 30 comprises a corrective delay means 51 and a selection means 50 for selecting delays of the corrective delay means 51 dependent on the phase difference output signal from the matching delay means 31. In the illustrated embodiment, the selection means 50 comprises a decoder 40 for decoding the output from the matching delay means 31 and a selection gate means 49. The output from the flip-flop $1_n$ is supplied to AND gates 32 through 35. Although an output from the AND gate 32 is supplied directly to an OR gate 41, outputs from the AND gates 33, 34, 35 are supplied through delay lines 37, 38, 39, respectively, to the OR gate 41. The delay lines 37, 38, 39 have delays of 1 nsec, 2 nsec, 3 nsec, respectively, and jointly constitute the corrective delay means 51.

The output from the matching delay means 31 is supplied to the decoder 40. In the decoder 40, the delayed output from the flip-flop 28 is supplied directly to AND gates 42, 43, and via an inverter 47 to AND gates 44, 45. The delayed output from the flip-flop 29 is supplied directly to the AND gates 42, 44, and via an inverter 48 to the AND gates 43, 45. As illustrated in FIG. 5, outputs from the AND gates 42 through 45 are such that the output from only one of the AND gates 42 through 45 is of a logic 1 dependent on the supplied binary data, that is, the outputs from the AND gates 42 through 45 are decoded into one of four conditions at all times.

An output from the decoder 40, that is, outputs from the AND gates 42 through 45, control the opening and closing of the AND gates 32 through 35. Thus, the AND gates 32 through 35 serve as the selection gate means 49 for selecting output binary signals. Since the phase detector circuit 25 is arranged to detect a phase difference $\phi$ as a lead in phase of the input binary signal relative to the clock, the corrective output means 30 is arranged such that where the phase difference detected by the phase detector circuit 25 between the input binary signal and the clock is smallest, the output binary signal is delayed relative to the clock to a greatest extent and issued. More specifically, where the phase difference $\phi$ is in the range of from 0 to 1 nsec, the AND gate 35 is opened to delay the output binary signal by 3 nsec and the delayed output signal is applied to the output terminal 13. Where the phase difference $\phi$ detected by the phase detector circuit 25 between the input binary signal and the clock is determined as belonging to the most delayed region, that is, where the output from the flip-flop 23 is of a logic 1, the AND gate 32 in the selector circuit 49 is opened to allow the output binary signal from the clocked logic circuit 24 to be supplied, without being delayed at all, to the output terminal 13. With this embodiment, the clock period To (4 nsec) is equal to the sum of the phase difference $\phi$ detected by the phase detector circuit 25 as a phase lead of the input binary signal and the phase delay given to the output binary signal by the corrective delay means 51. However, it should be noted that if the phase difference $\phi$ is defined to be an amount of delay of the input binary signal relative to the clock, then the selection means 50 should be arranged to select the same amount of delay as the amount of the detected phase difference.

Figure 7:
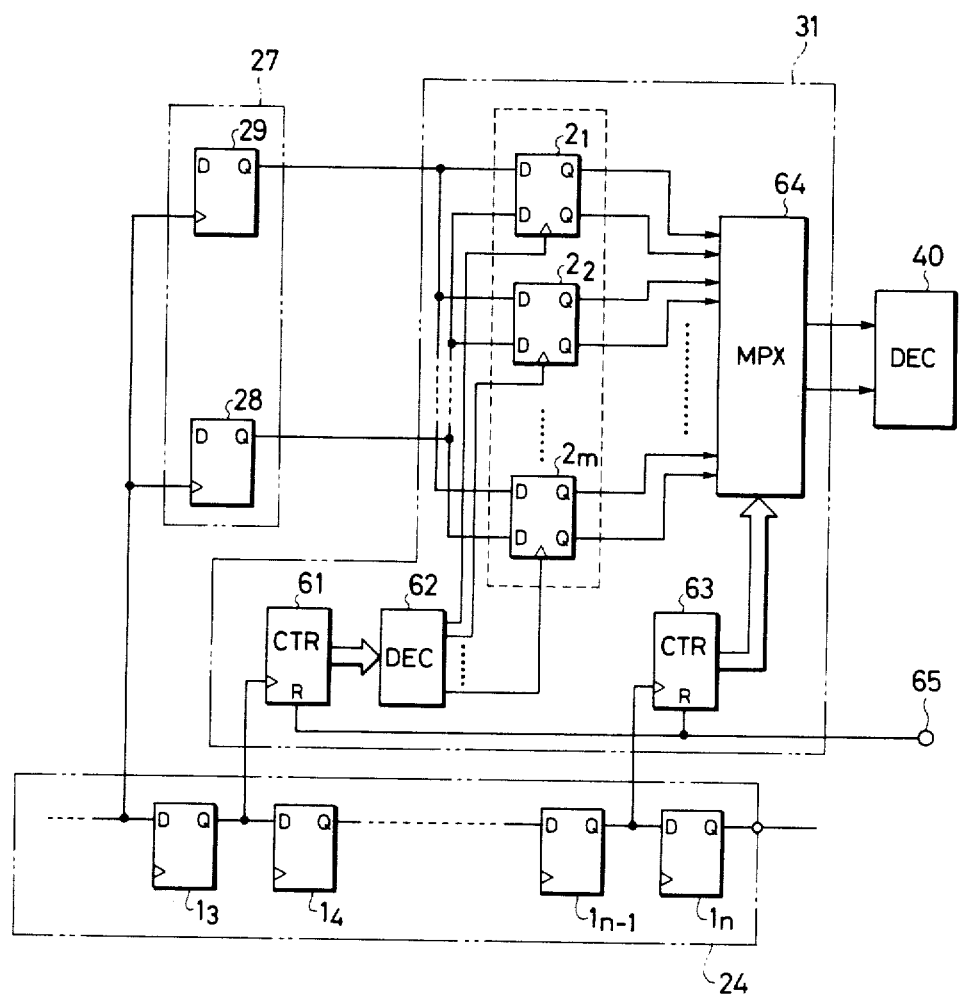
FIG. 7 is a logic diagram of a matching delay means.

As illustrated in FIG. 6, the phase detector circuit 25 may be arranged such that the clock from the terminal 12 is supplied through the buffers 16$a$, 16$b$, 16$c$ to the respective delay lines 17, 18, 19, and the input binary signal from the terminal 11 is supplied to the trigger terminals of the flip-flops 21, 22, 23. With this arrangement, the outputs from the flip-flops 21, 22, 23 are differently combined to produce a phase difference signal dependent on which of the four phase regions the phase difference between the input binary signal and the clock falls in. Since the phase difference signal varies in the arrangements in FIGS. 3 and 6 even with the same phase difference detected, the encoder 26 should be of a different circuit arrangement in case the phase detector circuit 25 of FIG. 6 is employed. In the embodiment of FIG. 6, it is necessary to arrange the clock to have a duty ratio 1/k (k is the dividing number of the clock period To and l is an integer satisfying $1 \leq l \leq k-1$) and the logic combination of the outputs of the $k-1$ flip-flops 21, 22, . . . for phase detection varies depending on the value l even for the same phase difference. Moreover, since the phase difference detection is performed by triggering the flip-flops 21, 22, 23 with the rise of the input binary signal, the latched logic states of the flip-flops 21, 22, 23 are held until the succeeding rise of the input binary signal and therefore the embodiment of FIG. 6 does not necessitate the latch means 27 which is required in the embodiment of FIG. 3.

Where the desired total delay for the input binary signal is smaller than 10 times the clock period To, for example, the outputs from the flip-flops 28, 29 in the matching delay means 31 of FIG. 3 may be delayed by the two delay lines. However, in case the desired total delay is relatively long, the delay means 31 should preferably be constructed of a logic circuit as shown in FIG. 7. More specifically, in FIG. 7, the outputs from the flip-flops 28, 29 are supplied to a plurality of latch circuits $2_1, 2_2, \ldots 2_m$ known generally as a multi-port RAM. An output from the clocked logic circuit 24 at its suitable timing position, e.g., an output from the flip-flop $1_3$ supplied with the trigger for the flip-flops 28, 29, is supplied to a counter 61 which counts rising edges of the input binary signal. The count from the counter 61 is decoded by a decoder 62, and outputs from m output terminals of the decoder 62 are supplied as latch commands to the corresponding latch circuits $2_1$ through $2_m$. Therefore, data (phase difference signal) indicative of the phase difference between the input binary signals and the clock are successively latched by the latch circuits $2_1, 2_2, \ldots 2_m$. When a data item is latched by the latch circuit $2_m$, thereafter the data are successively latched by the latch circuits starting with the latch circuit $2_1$.

A signal applied as an input to the flip-flop $1_n$, for example, is supplied as a signal corresponding to the delay in the clocked logic circuit 24 to a counter 63 which counts rising edges of the input binary signal. The count from the counter 63 is supplied as a control signal to a multiplexer 64 which is also supplied with 2-bit data from the latch circuits $2_1$ through $2_m$. The multiplexer 64 is responsive to the count from the counter 63 for selecting and issuing one of the 2-bit data to the decoder 40. Each of the counter 63 and the counter 61 comprises a modulo-m counter. The 2-bit phase difference signals from the flip-flops 28, 29 are delayed dependent on the delay in the clocked logic circuit 24, and the delayed signals are supplied to the decoder 40. Prior to operation of the circuit of FIG. 7, the counters 61, 63 are reset by a reset command from a terminal 65 for simultaneous initialization. It is apparent that, since the data holding period of the latch means 27 comprising the flip-flops 28, 29 is equal to that of each of the latch circuits $2_1$ through $2_m$, the latch means 27 can be omitted. In this latter case, the counter 61 is to be incremented by the input of the flip-flop $1_3$ instead of the output thereof.

Figure 8:
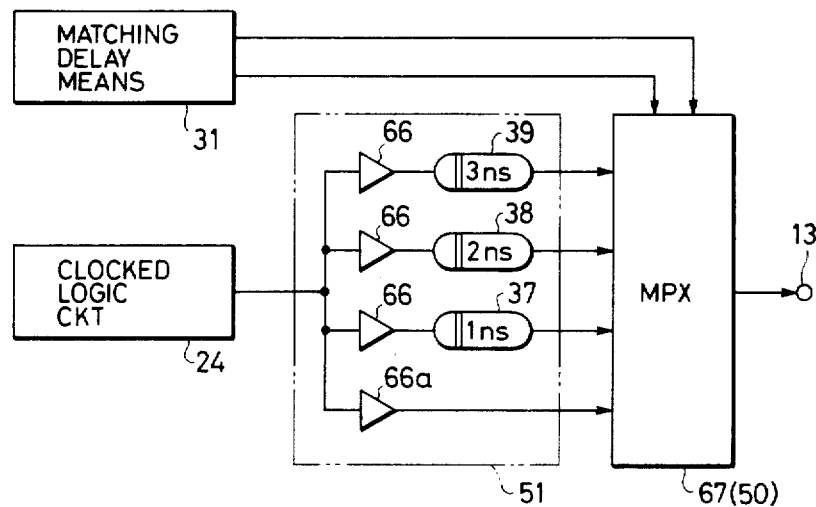
FIGS. 8 and 9 are logic diagrams of arrangements in which a selection means is disposed following a corrective delay means.

Although in FIG. 3 the output from the selection means 50 is supplied to the corrective delay means 51, the delayed output from the corrective delay means 51 may be selected by the selection means 50. As shown in FIG. 8, for example, the output binary signal from the clocked logic circuit 24 is supplied through buffers 66 to the delay lines 37, 38, 39 in the corrective delay means 51, and outputs from the delay lines 37, 38, 39 are supplied to a multiplexer 67 serving as the selection means 50. The output binary signal from the clocked logic circuit 24 is supplied through a buffer 66a to the multiplexer 67, which is controlled by a control signal which is the phase difference signal supplied from the matching delay means 31. The phase difference signal applied to the multiplexer 67 selects one of the outputs from the delay lines 37, 38, 39 and the buffer 66a, and the selected output is issued to the output terminal 13. The output selection is effected in the same manner as that of the selection means 50 in FIG. 3. For example, where the input binary signal has a pulse width (i.e. an ON-period) of 8 nsec and its minimum varying interval is 25 nsec, the output selection in the selector means 50 of FIG. 3 may be carried out any time during the OFF-period given by $25-8=17$ nsec, but the output selection in the selection means 50 of FIG. 8 should be carried out during a period given by $25-8-3=14$ nsec due to the delay control period by the corrective delay means 51. Therefore, the arrangement of FIG. 3 has a greater operation margin.

Figure 9:
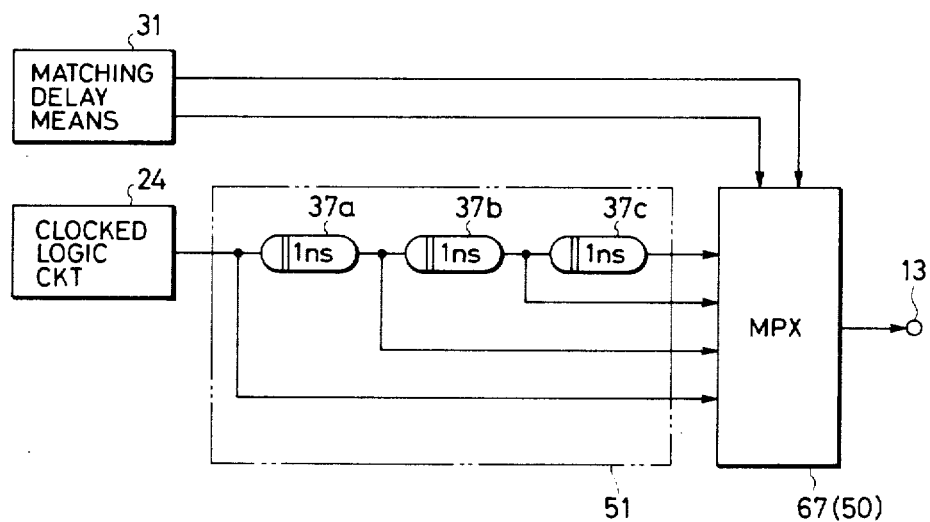

As illustrated in FIG. 9, the corrective delay means 51 may be of an arrangement such that the output binary signal from the logic circuit 24 is supplied to one terminal of the multiplexer 67 through a series-connected array of delay lines 37a, 37b, 37c having respective delays of 1 nsec, and the outputs of the logic circuit 24 and the delay lines 37a, 37b are connected respectively to other terminals of the multiplexer 67.

Figure 10:
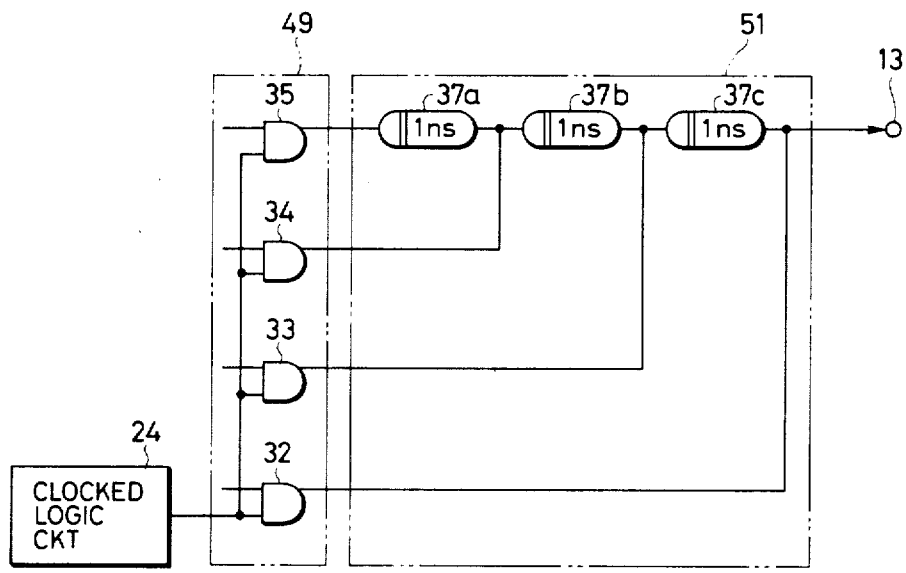
FIG. 10 is a logic diagram of another arrangement in which a selection means is disposed following a corrective delay means.

Alternatively, as shown in FIG. 10, the series-connected array of 1 nsec delay lines 37a, 37b, 37c may be employed, and the selection gate means 49 may be disposed in front of the corrective delay means 51.

Figure 11:
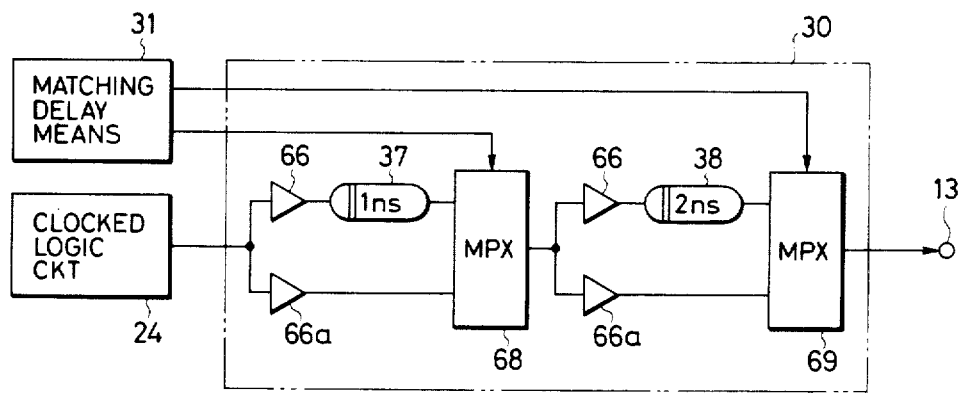
FIG. 11 is a logic diagram of an arrangement in which a selection means and a corrective delay means are combined.

The selection means 50 and the corrective delay means 51 may be combined together. For example, as shown in FIG. 11, the output binary signal from the logic circuit 24 is supplied through a buffer 66a to a multiplexer 68 and also through a buffer 66 and a delay of line 37 of a delay 1 nsec to the multiplexer 68. The multiplexer 68 is controlled by the output of the matching delay means 31 corresponding to the output of the flip-flop 28 so that when the output of the matching delay means 31 is "0", the buffer 66a is selected, and when the output is "1", the delay line 37 is selected. An output from the multiplexer 68 is supplied through a buffer 66a and a series connection of a buffer 66 and a delay line 28 of a delay of 2 nsec, to a multiplexer 69. The multiplexer 69 is controlled by the output from the flip-flop 29 through the delay means 31 to select outputs and applies the selected output to the output terminal 13. The delay line 37 and the multiplexer 68, and the delay line 38 and the multiplexer 69 jointly constitute the correction output means 30.

Figure 12:
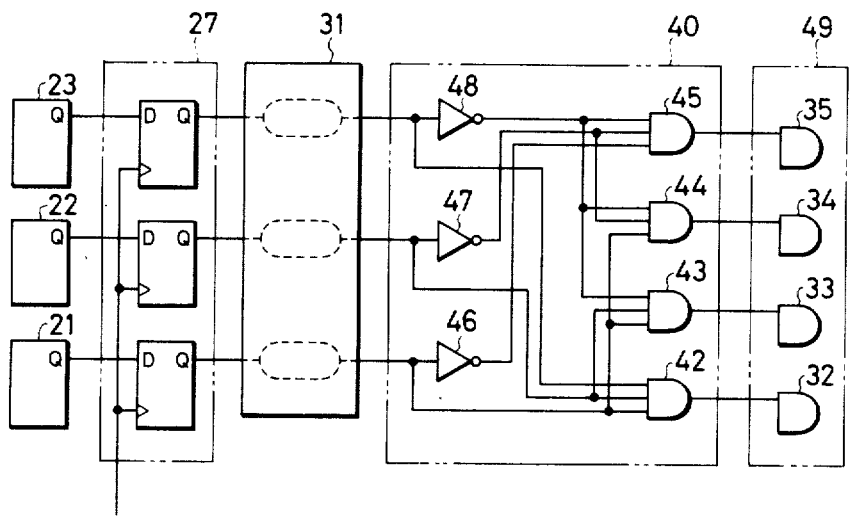
FIG. 12 is a logic diagram of a circuit for supplying a non-coded phase difference signal to a selection gate means.

The output from the phase detector circuit 25 may be supplied, without being encoded by the encoder 26, to the matching delay means 31 via the latch means 27. As shown in FIG. 12, the output from the matching delay means 31, corresponding to the output from the flip-flop 21, is supplied to AND circuits 42, 43, 44, and through an inverter 46 to an AND circuit 45. Likewise, the output from the matching delay means 31, corresponding to the output from the flip-flop 22, is supplied to the AND circuits 42, 43, and through an inverter 47 to the AND circuits 44, 45. Furthermore, the output from the matching delay means 31, corresponding to the output from the flip-flop 23, is supplied to the AND circuit 42, and through an inverter 48 to the AND circuits 43, 44, 45. Outputs from the AND circuits 42 through 45 are supplied to the gates 32 through 35. The AND circuits 42-45 and the inverters 46-48 constitute the decoder 40.

Figure 13:
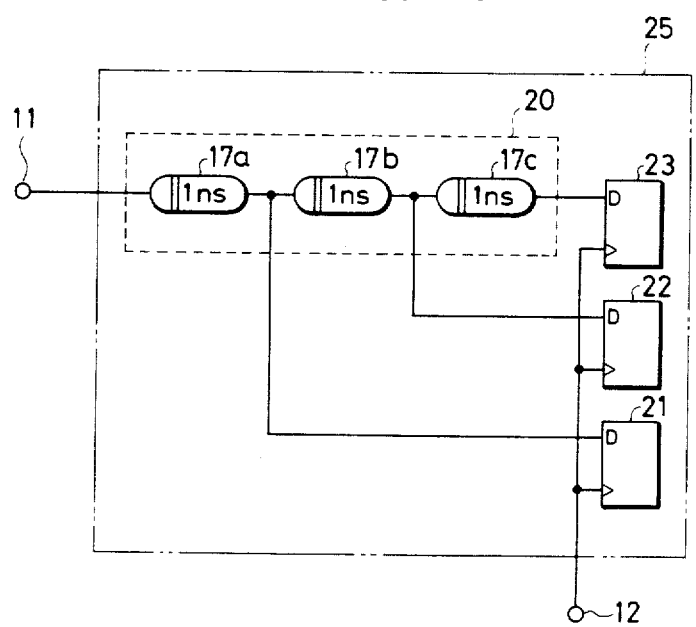
FIG. 13 is a logic diagram of another phase detector circuit.

The phase detecting delay means 20 shown in FIGS. 3 and 6 may be constructed in a manner similar to the delay means 51 shown in FIG. 9. For example, as illustrated in FIG. 13, the input terminal 11 is connected through a series-connected array of delay lines 17a, 17b, 17c each having a delay of 1 nsec to the flip-flop 23, and the outputs of the delay lines 17a, 17b are connected to the flip-flops 21, 22, respectively.

The clocked logic device of the present invention may be applied to various clocked logic circuits other than the clocked logic delay circuit. FIG. 14 shows an example where the present invention is applied to control the phase of the delayed output from the clocked logic delay circuit 24 with the corrective output means 30 in the same manner as shown in FIG. 3, and, at the same time, to shift the oscillation phase of a logic oscillation circuit 52, which is oscillating in synchronism with the clock, such that the oscillation phase may coincide with, for example, the leading edges of the input binary signal with an accuracy of To/k. That is, in this example, it is arranged such that synchronization phases of two clocked logic circuits 24, 52 are respectively controlled by the logic device of the present invention. As shown in FIG. 14, the input binary signal A at the input terminal 11 is supplied to the logic delay circuit 24 composed of the flip-flops $1_1$ to $1_4$ and also to the logic oscillation circuit 52 as the output C of the flip-flop $1_1$ to control the oscillation phase in synchronism with the clock B. The output G of the logic oscillation circuit 52 is supplied to a corrective output means 54, which in turn corrects the phase of the output therefrom with an accuracy of To/k in accordance with the phase difference between the input binary signal A and the clock B detected by the phase detector circuit 25 as is the case of FIG. 3. In this embodiment, the pulse width W of the input binary signal A is supposed to satisfy the relation To≦W<2To. The corrective output means 54 is of the same arrangement as that of the corrective output means 30 of FIG. 3 which is composed of the decoder 40, the selection gate means 49, and the corrective delay means 51. The output from the phase detector 25 is supplied through the delay means 31 as the phase difference signal to the corrective output means 54. As with the arrangement of FIG. 3, the corrective output means 54 gives the phase of the output G of the flip-flop 52e a delay corresponding to the phase difference detected by the phase detector circuit 25 between the input binary signal A and the clock B, and the delayed output I is applied to a terminal 56. FIGS. 15A through 15I illustrate the waveforms of signals at various circuit points shown in FIG. 14, which are denoted by corresponding reference characters A through I. As seen from FIGS. 15A and 15B, the leading edges of the first and third pulses of the input binary signal A happen to be substantially in agreement with the rises of the clock pulses B given at the terminal 12, but the second pulse of the input binary signal A happens to be fairly deviated from the rise of the clock B. Therefore, the phases of the first and third pulses of the delayed output binary signal (FIG. 15H) to be provided at the terminal 13 are controlled to exactly coincide with the rises of the clock (i.e. the phase differences of the first and third pulses of the input binary signal A relative to the clock pulses are detected to be zero) and the phase of the second pulse of the delayed output binary signal to be provided at the terminal 13 is phase-shifted with an accuracy of To/k relative to the clock by an amount corresponding to the detected phase difference of the second pulse as shown in FIG. 15H. Also, as shown in FIG. 15I, the synchronization phase of the oscillation output to be provided at the terminal 56 is controlled to coincide with each of the delayed output pulses shown in FIG. 15H. More specifically, a Q output C of the flip-flop 1₁ is supplied through an OR gate 52a to a data terminal D of a flip-flop 52b, and a Q output D of the flip-flop 52b is supplied to an AND gate 52c, which is also supplied with a Q̄ output of the flip-flop 1₁ as an inhibit signal. An output of the AND gate 52c is supplied to a data terminal D of a flip-flop 52d whose Q output E is fed back to the OR gate 52a. Where the Q output signal C of the flip-flop 1₁ is of the waveform as shown in FIG. 15C, and when its high level is applied to the oscillation circuit 52, the output D of the flip-flop 52b goes high in level in response to the next clock pulse as shown in FIG. 15D and is passed through the AND gate 52c. The output E of the flip-flop 52d goes high in level in response to a next clock pulse as shown in FIG. 15E and is fed through the OR gate 52a back to the flip-flop 52b. Therefore, the oscillation circuit 52 is now in the oscillating mode. The output C of the flip-flop 1₁ is delayed and issued from the flip-flop 1₄ as shown in FIG. 15F, and the output E from the flip-flop 52d is matched in phase with the output of the flip-flop 1₄ by the flip-flop 52e and issued as the output G of the oscillation circuit 52 as shown in FIG. 15G. The phases of the outputs from the flip-flops 1₄, 52e are corrected according to the phase difference between the input binary signal and the clock by the corrective output means 30, 54, and issued as shown in FIGS. 15H and 15I, respectively. By the way, as mentioned previously, since the pulse width W of the input binary signal in the embodiment of FIG. 14 is selected to satisfy the relation To≦W<2To, it is not necessary to provide the latch means 27 shown in FIG. 3 at the output side of the phase detector circuit 25.

In the above arrangement, the phase difference between the input binary signal and the clock is detected as falling in one of the four divided regions of the clock period, and the delay in the detected region is given to the output binary output signal by the corrective output means 30, 54. Generally, however, the clock period may be divided into k regions (k is an integer of 2 or more) to determine which of the k regions the phase difference between the input binary signal and the clock falls in, and the corrective output means may be arranged to give the corresponding delay j·To/k (j is an integer satisfying 0≦j≦k−1) to the binary output signal to issue the delayed output.

With the present invention, as described above, the output binary signal is corrected in accordance with what value the phase difference between the input binary signal and the clock may take, and the phase or delay error becomes 1/k of the clock period To or shorter than the time corresponding to To/k. Therefore, by increasing the value of k even at the same clock rate, there can be produced a delayed output of higher accuracy and an output synchronized in phase. For example, a delay error may be reduced as indicated by a line 58 in FIG. 2, the delay error being constant regardless of the delay time. Once the maximum allowable delay or phase is determined, flip-flops operating at a clock having a period which is k times the determined delay or phase may be employed. As a consequence, flip-flops having the slower operating speeds may be used, and the device can be constructed less costly.

Although certain preferred embodiments have been shown and described, it should be understood that many changes and modifications may be made therein without departing from the scope of the appended claims.

What is claimed is:

1. A clocked logic delay device which is supplied with an input binary signal of successive input pulses and which operates in synchronism with a clock signal which has a period To shorter than the width of each of the successive input pulses and which is asynchronous with respect to the input binary signal, for issuing an output binary signal of successive output pulses respectively corresponding to the successive input pulses, said clocked logic delay device comprising:

a phase detector circuit, supplied with the input binary signal and the clock signal, for detecting a phase difference between each of the input pulses of the input binary signal and the clock signal as a value corresponding to one of k time lengths into which the period To is divided, and for producing a phase difference signal jTo/k indicating the one of the k time lengths in which the phase difference falls, where k is an integer greater than or equal to 2 and j is an integer such that 0≦j≦(k−1);

a logic delay circuit including n cascade-connected stages of flip-flops, supplied with the input binary signal and the clock signal, for successively shifting the logic states of the input binary signal through said n cascade-connected stages of flip-flops in synchronism with the clock signal and for outputting the logic states as a delayed binary signal formed by delayed pulses which have been delayed with respect to corresponding one of the successive input pulses by a delay time D, where (n−1) To≦D<nTo and n is an integer greater than or equal to 2;

matching delay means connected to the output of said phase detector circuit for delaying the phase difference signal from said phase detector circuit for a predetermined period of time; and corrective output means, connected to the outputs of said logic delay circuit and said matching delay means, for further delaying each of the delayed pulses by a delay of jTo/k with respect to the clock signal in accordance with the delayed phase difference signal from said matching delay means, so that the sum of the further delay jTo/k of each of the delayed pulses and the time length corresponding to the phase difference detected with respect to the input pulse corresponding to the delayed pulse is a constant, the predetermined period by which the phase difference signal is delayed by said matching delay means being predetermined so that the phase difference signal reaches said corrective output means slightly before the corresponding one of the delayed pulses from said logic delay circuit.

2. The device of claim 1, wherein said corrective output means comprises:

selection means, connected to the outputs of said logic delay circuit and said matching delay means and including k output terminals, for outputting the delayed binary signal at a selected one of said k output terminals in accordance with each of the delayed phase difference signals from said matching delay means; and corrective delay means including an output terminal and k input terminals connected respectively to said k output terminals of said selection means, for delaying the respective output of said selection means by the respective jTo/k delay and delivering the delayed output, as the output binary signal, from the output terminal of said corrective delay means.

3. The device of claim 2, wherein said corrective delay means includes k delay lines having respective inputs connected to said k input terminals thereof and output ends connected in common through an OR circuit to said output terminal, each of said k delay lines providing a respective delay corresponding to the respective value of j.

4. The device of claim 2, wherein:

said corrective delay means includes (k−1) delay lines connected in series, with each having a delay of To/k;

said series-connected delay lines each have an input connected to a respective one of said k input terminals; and the output of the last of the series-connected delay lines and the remaining one of said k input terminals are connected to said output terminal.

5. The device of claim 1, wherein said corrective output means comprises:

corrective delay means, connected to the output of said logic delay circuit and including k output terminals, for outputting the delayed binary signal with a further respective delay of jTo/k at respective ones of said k output terminals; and selection means connected to the output of said matching delay means and including an output terminal and k input terminals connected respectively to said k output terminals of corrective delay means, for connecting one of said input terminals thereof to said output terminal in accordance with the delayed phase difference signal from said matching delay means.

6. The device of claim 1, wherein said corrective output means comprises:

a first cascade-connection of corrective delay means and selection means connected to the outputs of said logic delay circuit and said matching delay means, for providing a selected one of the delays jTo/k to the delayed binary signal; and a second cascade connection of corrective delay means and selection means, connected to the outputs of said first cascade connection and said matching delay means, for providing a selected one of the delays of jTo/k to an output signal from said first cascade connection, said selection means in said first and second cascade connections being operable to select respective said delays, so that a total delay caused through said first and second cascade connections corresponds to the further delay jTo/k in accordance with the delayed phase difference signal.

7. The device of claim 1, 2, 5 or 6, wherein said phase detector circuit comprises:

phase detecting delay means having an input terminal supplied with the input binary signal, for providing the input binary signal for respective delays iTo/k for respective integer values of i satisfying 1≦i≦(k−1) and for issuing the respective delayed signals to (k−1) respective output terminals thereof; and (k−1) flip-flops for receiving the (k−1) outputs from said phase detecting delay means in response to the clock signal wherein said (k−1) flip-flops produce respective outputs serving as the phase difference signal.

8. The device of claim 7, wherein said phase detecting delay means comprises (k−1) delay lines each having a respective one of said delays iTo/k, each said delay having an input connected in common to said input terminal of said phase detecting delay means and having an output connected to the respective output terminals thereof.

9. The device of claim 7, wherein said phase detecting delay means comprises (k−1) delay lines connected in series, each having a delay of To/k, the series connection of said delay lines having an input connected to said input terminal of said phase detecting delay means, and said (k−1) delay lines having output terminals connected respectively to said (k−1) output terminals of said phase detecting delay means.

10. The device of claim 1 2, 5 or 6, wherein said matching delay means comprises:

a first counter connected to an output of a first intermediate stage of said n cascade-connected stages of flip-flops for counting the successive input pulses;

a decoder, connected to said first counter, for decoding a count from said first counter;

a plurality of latch circuits, each connected to the outputs of said phase detector circuit and said decoder, for receiving successively in turn the respective phase difference signals in response to outputs from said decoder;

a second counter, connected to the output of a second intermediate stage of said n cascade-connected stages of flip-flops downstream from said first intermediate stage, for counting the successive input pulses; and a multiplexer, respectively connected to the outputs of said latch circuits and said second counter, for successively issuing the phase difference signals from said latch circuits in accordance with successive counts from said second counter.

11. The device of claim 2, 5 or 6, further comprising an encoder inserted between said phase detector circuit and said matching delay means of encoding the phase difference signal and supplying the encoded phase difference signal to said matching delay means, wherein said selection means includes a decoder, for decoding the encoded phase difference signal from said matching delay means, and selection gate means connected to the output of said decoder, for outputting from said corrective output means the output binary signal with the respective delay designated by the decoded phase difference signal.

12. The device of of claim 2, 5 or 6, further comprising an encloder inserted between said phase detector circuit and said matching delay means, for encoding the phase difference signal and for supplying the encoded phase difference signal to said matching delay means, wherein said selection means includes a multiplexer responsive to said encoded phase difference signal from said matching delay means for selecting the respective delayed for said output binary signal designated by said encoded phase difference signal.

13. The device of claim 2, 5 or 6, wherein said selection means comprises:

a decoder for receiving said phase difference signal and for outputting a signal designating the respective delay for the output binary signal; and selection gate means, connected to receive the output of said decoder, for outputting from said corrective output means the output binary signal with the respective delay.

14. The device of claim 1, 2, 5 or 6, comprising latch means inserted between the output of said phase detector circuit and the input of said matching delay means, for latching the phase difference signal in response to the input binary signal passing through a predetermined stage of said n cascade-connected stages of flip-flops.

15. The device of claim 1, 2, 5 or 6, wherein said phase detector circuit comprises:

phase detecting delay means having an input terminal supplied with the clock signal, for providing the clock signal for respective delays $iTo/k$ for respective integer values of i satisfying $1 \leq i \leq (k-1)$ and for issuing the respective delayed signals to $(k-1)$ respective output terminals thereof; and $(k-1)$ flip-flops for receiving the $(k-1)$ outputs from said phase detecting delay means in response to the input binary signal, wherein said $(k-1)$ flip-flops produce respective outputs serving as the phase difference signal.

* * * * *

UNITED STATES PATENT AND TRADEMARK OFFICE
CERTIFICATE OF CORRECTION

PATENT NO. : 4,719,365

DATED : January 12, 1988

INVENTOR(S) : Toshiaki MISONO

It is certified that error appears in the above-identified patent and that said Letters Patent is hereby corrected as shown below:

Column 6, line 34, "1/k" should be --$\ell$/k--;
line 35, "1" should be --$\ell$--;
line 35, "1≤ 1≤ k-1" should be -- $1 \leq \ell \leq k-1$ --;
line 38, "1" should be --$\ell$--.

Signed and Sealed this

Fifth Day of July, 1988

Attest:

DONALD J. QUIGG

Attesting Officer

Commissioner of Patents and Trademarks